(12) United States Patent
Krasnov et al.

(10) Patent No.: US 9,246,025 B2
(45) Date of Patent: Jan. 26, 2016

(54) BACK CONTACT FOR PHOTOVOLTAIC DEVICES SUCH AS COPPER-INDIUM-DISELENIDE SOLAR CELLS

(75) Inventors: Alexey Krasnov, Canton, MI (US); Willem den Boer, Brighton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 221 days.

(21) Appl. No.: 13/455,232

(22) Filed: Apr. 25, 2012

(65) Prior Publication Data

US 2013/0284251 A1 Oct. 31, 2013

(51) Int. Cl.
| | |
|---|---|
| H01L 31/0224 | (2006.01) |
| H01L 31/0392 | (2006.01) |
| H01L 31/0749 | (2012.01) |
| H01L 31/18 | (2006.01) |

(52) U.S. Cl.
CPC .. *H01L 31/022425* (2013.01); *H01L 31/03923* (2013.01); *H01L 31/0749* (2013.01); *Y02E 10/541* (2013.01)

(58) Field of Classification Search
USPC ........................................................ 136/256
See application file for complete search history.

(56) References Cited

U.S. PATENT DOCUMENTS

| | | | |
|---|---|---|---|
| 4,301,322 A * | 11/1981 | Amick | 136/256 |
| 4,335,266 A | 6/1982 | Mickelsen et al. | |
| 4,611,091 A | 9/1986 | Choudary et al. | |
| 4,915,745 A | 4/1990 | Pollock et al. | |
| 5,958,358 A | 9/1999 | Tenne et al. | |
| 6,077,722 A | 6/2000 | Jansen et al. | |
| 6,123,824 A | 9/2000 | Sano et al. | |
| 6,288,325 B1 | 9/2001 | Jansen et al. | |
| 6,784,361 B2 | 8/2004 | Carlson et al. | |
| 7,875,945 B2 | 1/2011 | Krasnov et al. | |
| 2004/0063320 A1 | 4/2004 | Hollars | |
| 2004/0144419 A1 | 7/2004 | Fix et al. | |
| 2004/0261841 A1 | 12/2004 | Negami et al. | |
| 2006/0180200 A1 | 8/2006 | Platzer Bjorkman et al. | |
| 2007/0093006 A1 | 4/2007 | Basol | |
| 2007/0193623 A1 * | 8/2007 | Krasnov | 136/252 |

(Continued)

FOREIGN PATENT DOCUMENTS

| | | |
|---|---|---|
| EP | 2 469 580 | 6/2012 |
| WO | WO 2006/047207 | 5/2006 |

(Continued)

OTHER PUBLICATIONS

Ametek, Molybdenum-Copper Composites AMC 6436 and AMC 3169, 2010, Metal Material Data Sheets, pp. 1-2.*

(Continued)

*Primary Examiner* — Jonathan Johnson
*Assistant Examiner* — Bethany L Martin
(74) *Attorney, Agent, or Firm* — Nixon & Vanderhye P.C.

(57) ABSTRACT

A photovoltaic device (e.g., solar cell) includes: a front substrate (e.g., glass substrate); a semiconductor absorber film; a back contact including a first conductive layer of or including copper (Cu) and a second conductive layer of or including molybdenum (Mo); and a rear substrate (e.g., glass substrate). The first conductive layer of or including copper is located between at least the rear substrate and the second conductive layer of or including molybdenum, and wherein the semiconductor absorber film is located between at least the back contact and the front substrate.

22 Claims, 4 Drawing Sheets

(56) References Cited

U.S. PATENT DOCUMENTS

| | | | |
|---|---|---|---|
| 2009/0020157 A1* | 1/2009 | Krasnov et al. | 136/256 |
| 2009/0260678 A1 | 10/2009 | Di Stefano | |
| 2009/0272422 A1 | 11/2009 | Li | |
| 2010/0236616 A1* | 9/2010 | Chuang | 136/256 |
| 2010/0236629 A1 | 9/2010 | Chuang | |
| 2010/0253204 A1* | 10/2010 | Boehler et al. | 313/141 |
| 2010/0297835 A1 | 11/2010 | Chuang et al. | |
| 2010/0300512 A1* | 12/2010 | Auvray et al. | 136/252 |
| 2011/0097841 A1 | 4/2011 | Krasnov et al. | |
| 2011/0168243 A1 | 7/2011 | Elowe et al. | |
| 2012/0174977 A1 | 7/2012 | Choi | |

FOREIGN PATENT DOCUMENTS

| | | | |
|---|---|---|---|
| WO | WO 2012/033033 | 3/2012 | |
| WO | WO2013112217 * | 8/2013 | B32B 15/04 |

OTHER PUBLICATIONS

U.S. Appl. No. 13/455,282, filed Apr. 25, 2012; Krasnov.

U.S. Appl. No. 13/455,317, filed Apr. 25, 2012; Krasnov et al.

U.S. Appl. No. 13/455,300, filed Apr. 25, 2012; Krasnov.

"Electrochemical Codeposition of Indium and Gallium for Chalcopyrite Solar Cells", Zank et al., Thin Solid Films 286 (1996), pp. 259-263.

"Chalcopyrite Thin Film Solar Cells by Electrodeposition", Lincot et al., Solar Energy 77 (2004), pp. 725-737.

"Effect of a Thermal Oxydation Pre-Treatment on Mo to Control the Growth and Formation of $MoSe_2$ Layers for Use for CIGS Solar Cells"; Duchatelet et al., 25$^{th}$ European Photovoltaic Solar Energy Conference and Exhibition, Sep. 6-10, 2010, pp. 3379-3381.

"A Comprehensive Characterization of the Interfaces in Mo/CIS/CdS/ZnO Solar Cell Structures"; Schmid et al., Solar Energy Materials and Solar Cells 41/42, (1996); pp. 281-294.

"Cu-Mo Contacts to $CuInSe_2$ for Improved Adhesion in Photovoltaic Devices"; Yang et al., Journal of Applied Physics; Jan. 15, 1994; vol. 75, No. 2; pp. 1185-1189.

International Search Report mailed Jun. 12, 2014.

"Electrodeposition of Indium on Copper for CIS/CIGS Solar Cell Applications"; Huang et al., 2010 The Electrochemical Society (1pg).

* cited by examiner

BACK CONTACT FOR PHOTOVOLTAIC DEVICES SUCH AS COPPER-INDIUM-DISELENIDE SOLAR CELLS

CROSS-REFERENCE TO RELATED APPLICATIONS

This application is related to U.S. patent application Ser. Nos. 13/455,282, 13/455,300, and 13/455,317 (now U.S. Pat. No. 8,809,674) the entire disclosures of which are incorporated by reference herein in their entireties.

TECHNICAL FIELD

Certain embodiments of this disclosure relate generally to photovoltaic devices (e.g., solar cells), a back contact or rear electrode for use in photovoltaic devices such as solar cells, coated articles for use in photovoltaic devices such as solar cells, and methods of making the same. Certain embodiments of this disclosure more particularly relate to a molybdenum-containing back electrode configuration that incorporates other metallic elements resulting in a lower-cost, high-efficiency solar cells. The back (or rear) electrode may also function as a rear reflector in certain example instances. According to certain example embodiments disclosed herein, a substantial portion of the traditional molybdenum back contact typically used in CIGS solar cells is substituted with copper, which is compatible with the CIGS absorber layer and does not significantly compromise performance of the solar cell.

BACKGROUND AND SUMMARY OF EXAMPLE EMBODIMENTS

Many different types of photovoltaic devices are known in the art (e.g., see U.S. Patent Document Nos. 2004/0261841, 2006/0180200, U.S. Pat. Nos. 4,335,266, 4,611,091, 6,784,361, 6,288,325, 6,631,603, and 6,123,824, the disclosures of which are incorporated by reference herein in their entireties). Examples of known photovoltaic devices include CIGS (approximately $Cu(In, Ga)(Se,S)_2$ and/or $CuIn_{x-1}Ga_xSe_2$) solar cells. CIGS films are conductive semiconductor compounds that are often referred to as an absorber or light absorbing layer(s). Generally speaking, CIGS type photovoltaic devices include, from the front (or light incident) side moving rearwardly, a front transparent cover sheet (or substrate) such as glass, a front electrode comprising a transparent conductive layer(s) (e.g., a transparent conductive oxide), a light absorption semiconductor film (e.g., CIGS), a rear electrode or contact, and a rear substrate of a material such as, for example, glass (or metal foil for certain example flexible applications). In some instances, an adhesive may be provided between the front substrate and the front electrode. It is also the case in some instances that the device is provided with window layer(s) (e.g., of or including CdS, ZnO, or the like). Photovoltaic power is generated when light incident on the front side (or front substrate) of the device passes through the front electrode and is absorbed by the light absorption semiconductor film (e.g., CIGS), as is known in the art.

For example, with reference to FIG. 1, there is generally provided a schematic cross-sectional diagram illustrating various elements of a CIGS-type photovoltaic device 10. The cell 10 is structurally supported on a rear glass substrate (or back glass) 12. A back contact made up of a metal layer, such as, for example, molybdenum (Mo) 14 is typically deposited on the rear glass substrate 12. The first active region of the device 10 comprises a semiconductor layer 16 which is typically a p-type copper indium/gallium diselenide (CIGS). A thin "window" layer of n-type compound semiconductor 18, typically comprising cadmium sulfide (CdS) may then be deposited on CIGS layer 16. A front electrode 20 is deposited on the CdS layer 18 and acts as a transparent front contact for the photovoltaic device 10. The device 10 may be completed by including a series of front face contacts (not shown) in the form of, for example, a metal grid on top of the transparent front contact 20 to facilitate the extraction of generated electrons, and a front glass substrate 22. A large solar cell may also be divided into a number or smaller cells by means of scribes, such as, for example, laser or mechanical scribes or the like, traditionally referred to as P1, P2 and P3, which allow individual cells to be connected in series.

As noted above, a metal such as Mo may be used as the rear electrode (or back contact) 14 of a photovoltaic device, such as, for example, a CIGS solar cell 10, to extract positive charges generated in the CIGS semiconductor absorber 16 of the solar cell 10. In certain instances, the Mo rear electrode 14 may be sputter-deposited using, for example, direct-current magnetron sputtering, onto the back glass substrate 12 of the CIGS solar cell 8. However, using Mo alone as the material for the back contact 14 of the solar cell 10 suffers from certain disadvantages. For example, Mo has a relatively high material cost and sometimes suffers from the problem of delamination from the back glass substrate. In addition, Mo typically exhibits relatively low conductivity and suffers from a relatively slow deposition rate, and thus causes correspondingly low production line throughput. As a result, using Mo as the material for the back contact accounts for a substantial portion of the total device cost. Moreover, one of the preferred requirements for a back contact for CIGS type solar cells is to achieve a sheet resistance (SR) on the order of about <1 ohm/square. In order for a Mo back contact to meet this requirement, the Mo thickness must typically range from 300-900 nm, depending upon the CIGS deposition method. In other words, the thicker the film, the lower its sheet resistance. This results in 15-25% of the total photovoltaic module cost.

Attempts have been made to use other types of metals as the sole material to form the back contact. These attempts have resulted in limited success with only a few other materials, such as, for example, tungsten (W), tantalum (Ta) and niobium (Nb), exhibiting sufficient compatibility with the CIGS absorber, e.g., not reacting with the CIGS absorber. However, these alternatives result in a lower CIGS device efficiency as compared to devices using Mo as the material for the back contact.

Unsuccessful attempts have been made to substitute Cu as the material for a back contact in a CIGS device. The Cu/CIGS stack was found to peel off during CIGS deposition. These attempts used methods, such as, for example, molecular beam epitaxy (MBE) for CIGS deposition. MBE is very different from the much faster processes currently being used for CIGS production, such as, for example, co-evaporation, sputtering, electroplating, and the like. In addition, these attempts used CIGS deposition at high temperatures instead of methods that use unheated deposition followed by high-temperature selenization. Moreover, the prior attempts failed to recognize advantages that could be realized by taking measures to mitigate stress between Cu and Mo, and to provide improved adhesion of Cu to the back glass substrate, as is provided by certain example embodiments disclosed herein.

In certain example embodiments of this invention, there is provided a photovoltaic device (e.g., solar cell) comprising: a front cover glass (substrate); a semiconductor absorber film;

a back contact comprising a first conductive layer comprising or consisting essentially of copper and a second conductive layer comprising or consisting essentially of molybdenum; and a rear substrate; wherein the first conductive layer comprising of consisting essentially of copper is located between at least the rear substrate and the second conductive layer comprising or consisting essentially of molybdenum, and wherein the semiconductor absorber film is located between at least the back contact and the front substrate.

In certain example embodiments disclosed herein, a substantial portion of the Mo back contact is substituted with copper (Cu), which is a less expensive and a more conductive alternative. It has been found that substituting Cu for a portion of the Mo of the back contact does not significantly compromise cell performance in a CIGS cell (of course, it will be understood that Cu used in back contact configurations may include certain trace or minor amounts of other elements of materials that do not substantially affect the performance or electrical characteristics of Cu, and as discussed herein, Cu may include an oxidation graded layer of Cu). The many advantages of using Cu as the bulk (or at least part) of the back contact include, for example, lower cost—Cu sputtering targets are typically at least two times less expensive than using Mo sputtering targets. Additionally, the sputter deposition rates of Cu are typically at least two times greater than that of Mo. For example, and without limitation, deposition rates for Mo tend to range from about 2.8 to 3.6 nm/kW, while deposition rates for Cu tend to range from about 7.2 to 8.2 nm/kW, thereby providing improvements in throughput and thus more efficient and faster manufacturing. Another advantage of using Cu in the back contact is that sputtered Cu has 4 to 5 times greater conductivity as compared to sputtered Mo. For example, and without limitation, sputtered Cu conductivity may be about $60.7 \times 10^6$ $Sm^{-1}$, as compared to $15.5 \times 10^6$ $Sm^{-1}$ for Mo. Therefore, in order to reach substantially the same sheet resistance as a simple Mo back contact, a multi-layer back contact configuration including Cu and Mo could be made for example 4 to 5 times thinner than using Mo alone. Moreover, Cu is compatible with the CIGS absorber since Cu is a main component of the CIGS absorber. The Cu is also separated from the CIGS absorber by the Mo layer, so only traces of Cu from the back contact may reach the CIGS absorber due to heating/diffusion without substantially altering its stoichiometry. It will also be understood that the Cu may include trace or minor amounts of other elements or materials that do not substantially affect the performance or electrical properties of Cu.

In further example embodiments disclosed herein, a stress matching or adhesion layer of or including copper oxide (e.g., $CuO_x$) may be formed between the back glass substrate and a copper based layer. Optionally, the copper based layer may be an oxidation graded copper layer having greater oxidation at a portion adjacent the back glass substrate, such that the portion having the greater oxygen concentration can provide a stress matching function of a copper oxide stress matching layer. A conductive Mo layer is deposited on top of the conductive copper layer. One or both of the Cu and/or Mo layers may be reflective layers in certain example embodiments. It will be understood in example embodiments including an oxidation graded conductive layer, the grading need not be continuous, and may be discontinuous. By providing a stress matching/adhesion layer and/or oxidation graded Cu layer, improved adhesion of the Cu layer to the back substrate may be achieved.

According to an example embodiment disclosed herein, to mitigate mechanical problems that may be associated with a mismatch of the coefficient of thermal expansion (CTE) between layers, a MoCu alloy may optionally be provided as a CTE matching layer between the Mo and Cu of the multi-layer back contact configuration.

In accordance with these and other example embodiments disclosed herein, the portion of the back contact between the Cu and the CIGS absorber continues to be of or including Mo. The use of Mo between the Cu and the CIGS absorber has numerous operational and structural advantages. Among these advantages is that Mo forms a thin (e.g., 3-50 nm, depending on Mo quality parameters, such as, for example, density, purity, stress, etc.) molybdenum selenide ($MoSe_2$) layer at its interface with the CIGS absorber during the high-temperature selenization process used to form the CIGS absorber. The formation of a $MoSe_2$ layer is beneficial for the CIGS device in that it results in the formation of an ohmic (non-rectifying) contact to the CIGS absorber which, in turn, facilitates hole extraction with minimum losses. Another advantage of continuing to use Mo between the Cu and the CIGS absorber is that Mo works well with the optional second mechanical scribe in the CIGS photovoltaic module manufacturing process. Sputter deposited Mo also produces a specific surface morphology that is beneficial for CIGS growth and particularly for the formation of crystallites with large grains sizes that result in high carrier mobility and thus, higher device efficiency.

These and other example embodiments and example advantages are described herein with respect to certain example embodiments and with reference to the following drawings in which like reference numerals refer to like elements, and wherein:

DETAILED DESCRIPTION OF EXAMPLE EMBODIMENTS

Figure 1:
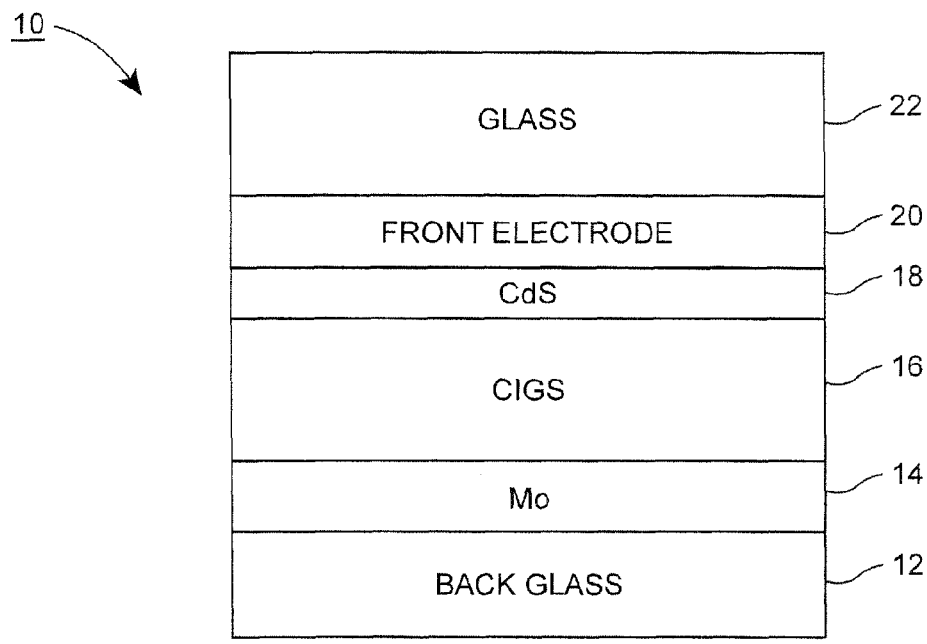
FIG. 1 is a cross sectional view of an example known CIGS photovoltaic device.

Referring now more particularly to the figures in which like reference numerals refer to like elements in the several views, detailed descriptions of example embodiments are disclosed herein.

Photovoltaic devices such as solar cells convert solar (or other light) radiation into usable electrical energy. The energy conversion typically occurs as a result of the photovoltaic effect. Light radiation (such as, for example, sunlight) impinging on a photovoltaic device and absorbed by an active region of semiconductor material (e.g., a semiconductor film including one or more semiconductor layers, such as, for example, CIGS), sometimes called an absorbing layer or film, generates electron-hole pairs in the active region. The electrons and holes may be separated by an electric field of a junction in the photovoltaic device. The separation of electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region (or vice versa) as impinging light energy continues to generate electron-hole pairs in the photovoltaic device.

In certain example embodiments disclosed herein, the absorption film, or absorber, may be of or include CIGS (approximately $Cu(In, Ga)(Se, S)_2$). In certain example embodiments disclosed and described herein, there is provided a rear opaque and/or reflective electrode for CIGS photovoltaic (e.g., solar cell) devices that is deposited using magnetron sputter-deposition of at least molybdenum (Mo) and copper (Cu) in a multi-layer configuration, in which, for example, the thickness of the Mo layer may be, for example, preferably in the range of 5-300 nm and the thickness of the Cu layer may be, for example, preferably in the range of 20-200 nm thick. In certain example embodiments, the back contact may have a reduced thickness compared to conventional pure Mo back contacts.

In addition, according to example embodiments described and disclosed herein, an additional stress matching or adhesion layer including copper oxide ($CuO_X$) may be provided between the Cu layer and the back glass substrate. A $CuO_X$ layer provided adjacent the back glass substrate and between the back glass substrate and the Cu layer is used to form a solid bond between the Cu and the back glass substrate, as metal copper does not generally stick well to the glass. The $CuO_X$ layer may be stoichiometric, or substoichiometric, in example embodiments. This stress matching or adhesion layer of or including $CuO_X$ may be deposited by reactive sputtering from a metal Cu target in an argon and oxygen ($Ar+O_2$) atmosphere, with oxygen partial pressures being, for example, and without limitation, around about 0.3 to 0.6 mTorr. The resulting thickness of the $CuO_X$ matching/adhesion layer is, for example, preferably in a range of 3-50 nm. Other possible alternatives for matching/adhering Cu to the back glass substrate may include, for example, and without limitation, a thin (e.g., ~1-10 nm) titanium (Ti) or chromium (Cr) based layer. Alternatively, the conductive copper layer may be an oxidation graded copper layer having greater oxidation at a portion adjacent the back glass substrate, such that the portion having the greater oxygen concentration can provide the stress matching function of a copper oxide stress matching layer. It will be understood in example embodiments including an oxidation graded conductive layer, the grading need not be continuous, and may be discontinuous. By providing a stress matching/adhesion layer or an oxidation graded Cu layer, improved adhesion of the Cu layer to the back glass substrate may be achieved.

In addition, according to example embodiments disclosed and described herein, an additional matching layer may be introduced to reduce mechanical problems that may possibly be associated with the Mo/Cu back contact stack. For example, a mismatch in the linear coefficient of thermal expansion (CTE) may be present between the Mo and Cu of the multi-layer back contact stack. In an effort to reduce the possibility of mechanical problems in the Mo/Cu stack in other possible designs (e.g., thicker layers, higher temperatures, additional layers, etc.), according to an example embodiment, a CTE matching layer of a MoCu alloy between the Mo and Cu may be introduced. Such a layer may be deposited using, for example, sputter deposition. Conductive MoCu composites provide flexibility and easily tailor the CTE and provide good thermal conductivity. Table I below demonstrates excellent CTE matching properties of MoCu alloys for Mo (CTE ~$17\times10^{-6}/°$ K) and Cu (CTE ~$5\times10^{-6}/°$ K) layers.

TABLE I

| Material Composition (wt %) | CTE ($10^{-6}/°$ K) |
|---|---|
| 70Mo/30Cu | 8.0 |
| 60Mo/40Cu | 9.3 |
| 50Mo/50Cu | 10.3 |

In accordance with these and other example embodiments disclosed herein, the portion of the back contact between the Cu and the CIGS absorber continues to be of or including Mo. The use of Mo between the Cu and the CIGS absorber has numerous operational and structural advantages. Among these advantages is that Mo forms a thin (e.g., about 3-60 nm, depending on Mo quality parameters, such as, for example, density, purity, stress, etc.) molybdenum selenide ($MoSe_2$) layer at its interface with the CIGS absorber during the high-temperature selenization process used to form the CIGS absorber. The formation of a $MoSe_2$ layer is beneficial for the CIGS device in that it results in the formation of an ohmic (non-rectifying) contact to the CIGS absorber which, in turn, facilitates hole extraction with minimum losses. Another advantage of continuing to use conductive Mo between the conductive Cu and the CIGS absorber is that Mo works well with the second mechanical scribe in the CIGS photovoltaic module manufacturing process. Sputter deposited Mo also produces a specific surface morphology that is beneficial for CIGS growth and particularly for the formation of crystallites with large grains sizes that result in high carrier mobility and thus, higher device efficiency.

Figure 2:
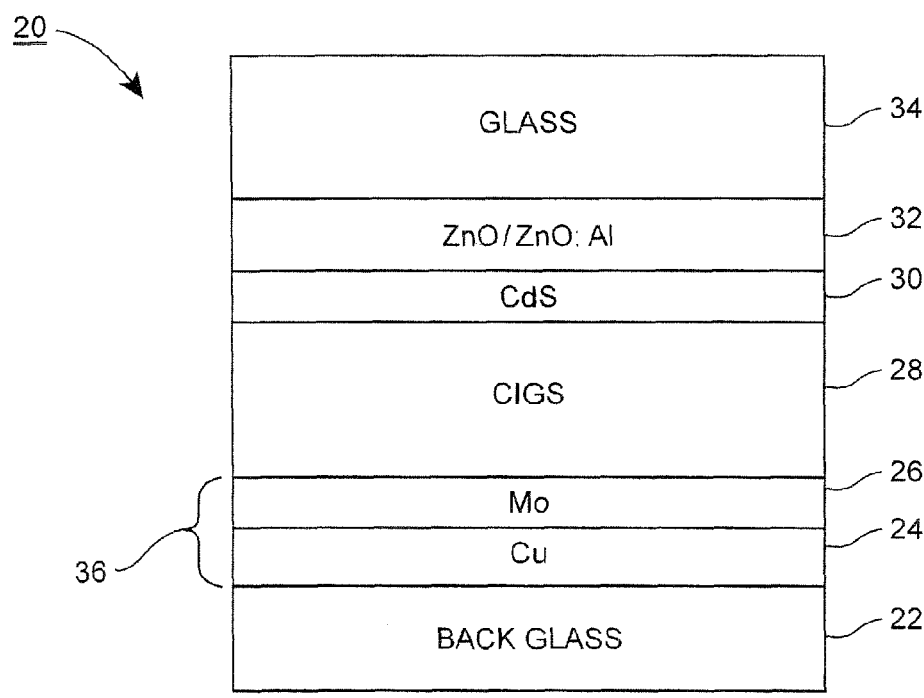
FIG. 2 is a cross sectional view of an example photovoltaic device according to certain example embodiments disclosed herein.

With reference to FIG. 2, a cross section of an example CIGS photovoltaic device including a multi-layer back contact configuration comprising Mo and Cu according to an example embodiment is illustrated. The photovoltaic device (e.g., solar cell 20) is structurally supported on a back glass substrate 22, which may, for example, and without limitation, comprise soda-lime-silica based glass. A multi-layer back contact structure 36 comprising a conductive layer of or including Cu 24 and a conductive layer of or including Mo 26 is deposited on the back glass substrate 22. In an example embodiment, a preferred method of depositing the Cu layer 24 and the Mo layer 26 is by direct-current magnetron beam sputtering. Optionally, a dielectric layer (not shown) (e.g., of or including silicon nitride and/or silicon oxynitride) may be provided directly on the back substrate 22 so as to be located between the back substrate 22 and the Cu based layer 24. The thickness of the Mo layer 26 may preferably be, for example, in the range of about 5-300 nm, and the thickness of the Cu layer 24 may preferably be, for example, in the range of about 20-200 nm thick. The thickness of the Mo layer 26, may further preferably be in the range of about 10-200 nm and even more preferably from about 25-60 nm or about 40 nm. The thickness of the Cu layer 24, may further preferably be in the range of about 40-150 nm, and even more preferably from about 70-130 nm or about 100 nm. The copper (Cu) layer 24 may or may not be oxidation graded in certain example embodiments (where the higher oxygen content portion is closer to substrate 22), and may optionally be doped with other material(s). In different embodiments regarding FIG. 2, the Cu layer 24 may be (i) metallic, (ii) mostly metallic, (iii)

oxidation graded, and/or (iv) made up of a metallic layer portion and an oxygen inclusive layer portion where the oxygen inclusive layer portion is closer to the substrate 22.

Still referring to FIG. 2, the active or absorbing region of the device 20 is then formed on the Mo based layer 26 of the back contact 36, and preferably contains a semiconductor film 28 comprising copper indium diselenide and/or p-type CIGS layer (approximately $Cu(In, Ga)(Se, S)_2$). The CIGS layer 28 may be deposited by co-evaporation, sputtering, electroplating or any other suitable method. For example, and without limitation, an example method of forming CIGS begins with providing a layer of or including deposited Cu (using electroplating or any other deposition technique, as noted above), other components of the CIGS, e.g., indium and/or gallium are deposited on a Cu layer and then react with the Cu at high temperatures in a selenium atmosphere, forming the CIGS semiconductor absorber 28. Formation of the CIGS absorber layer 28 may optionally be followed by wet-deposition of a cadmium sulfide (CdS) window layer 30. The device 20 may then be provided with a wide bandgap conductor or semiconductor material 32 by deposition of, for example, a substantially transparent conductive layer of or including tin oxide, zinc oxide, zinc aluminum oxide, or any other suitable transparent conductive electrode. In a preferred, non-limiting, example, a bi-layer 32 of or including a ZnO layer and an n-type conductive Al-doped ZnO layer may be deposited on the CdS window layer 30. The ZnO/ZnO:Al transparent conductive film 32 may serve as a front transparent electrode/contact of the photovoltaic device 20. The device 20 may then be finished by providing a series of front face contacts in the form of, for example, a metal grid (not shown), on top of the transparent front contact 32 to facilitate extraction of generated electrons, and a front (light incident side) glass substrate 34.

While a preferred embodiment according to the FIG. 2 embodiment is made up of the layers shown in FIG. 2, other non-illustrated layer(s) may also be provided. For example, an anti-reflection film (not shown) may be provided on the light incident side of the front substrate 22, a further electrode or dielectric layer(s) may be provided between the front substrate 34 and the front electrode 32, and so forth. As another example, a dielectric layer (e.g., of or including silicon nitride and/or silicon oxynitride) may be provided on the back substrate 22 so as to be located between at least the back substrate 22 and the Cu based layer 24.

Figure 3:
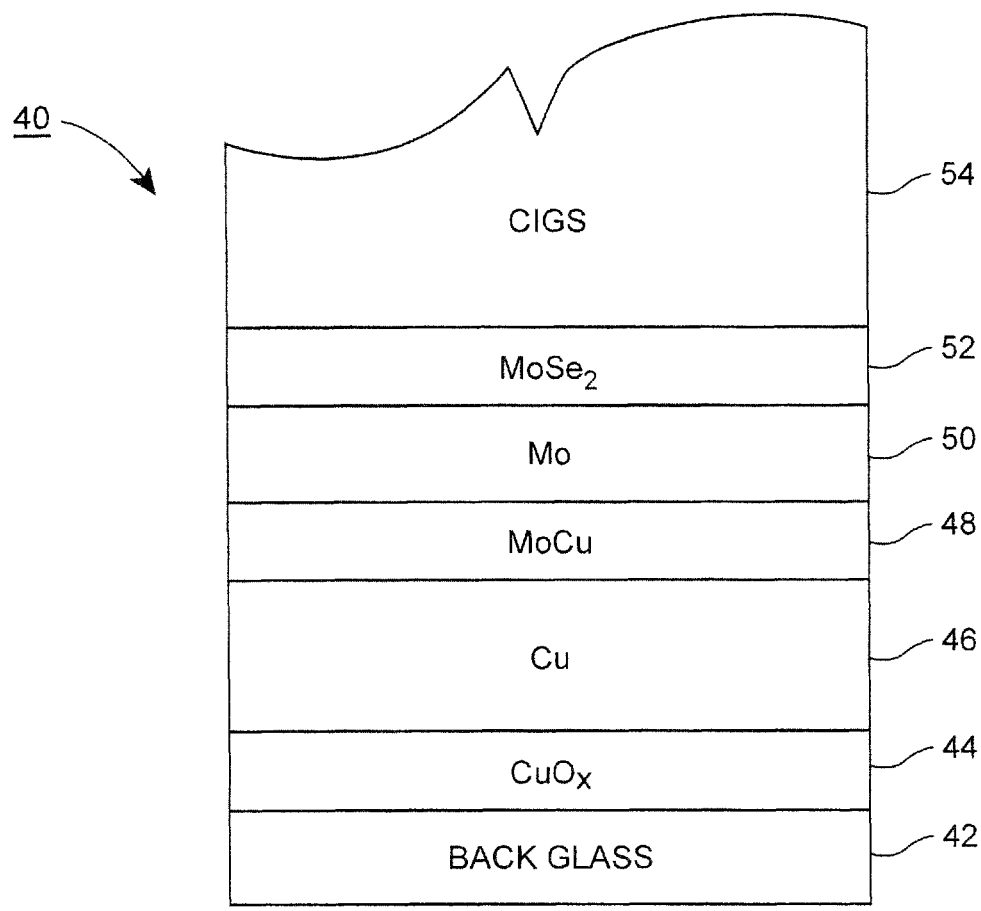
FIG. 3 is a cross sectional view of an example coated article for use in a photovoltaic device, such as, for example, a solar cell according to certain example embodiments disclosed herein.

As discussed above, according to a further example embodiment, it may be preferable to provide additional layers to improve the performance and characteristics of the photovoltaic device disclosed herein. Referring to FIG. 3, a cross section of an example embodiment is illustrated. According to the FIG. 3 embodiment, the device 20 of FIG. 2 is provided with one or more additional layers that are not expressly illustrated in FIG. 2, including, for example, and without limitation, one or more of a matching/adhesion layer 44, a CTE matching layer 48 and/or an ohmic contact layer 52, each of which will be described in further detail herein, to form a coated article 40 for use in a photovoltaic device, such as, for example, a solar cell. It will be understood that the materials, thicknesses and deposition techniques discussed above with respect to FIG. 2 apply equally to the description of the example embodiment illustrated in FIG. 3. For example, Cu layer 46 in FIG. 3 corresponds to Cu layer 24 described above in connection with FIG. 2, Mo layer 50 in FIG. 3 corresponds to Mo layer 26 described above in connection with FIG. 2, CIGS film 54 in FIG. 3 corresponds to CIGS film 28 described above in connection with FIG. 2, layers 30-34 from FIG. 2 may also be present in the FIG. 3 embodiment, and so forth. As discussed above, an additional stress matching or adhesion layer 44 of or including copper oxide (e.g., $CuO_X$) may be provided between the Cu layer 46 and the back glass substrate 42. The $CuO_X$ layer 44, which may, for example, preferably be provided adjacent the back glass substrate 42 and between the back glass substrate 42 and the Cu layer 46, is used to form a solid bond between the Cu 46 and the back glass substrate 42, as metallic copper which may be used for layer 46 does not generally stick well to the glass 42. This stress matching or adhesion layer of $CuO_X$ 44 may, for example, preferably be deposited by reactive sputtering from a metal Cu target in an argon and oxygen ($Ar+O_2$) atmosphere, with oxygen partial pressures being, for example, and without limitation, around about 0.3 to 0.6 mTorr. The resulting thickness of the $CuO_X$ matching/adhesion layer 44 is, for example, preferably in a range of ~1-60 nm, more preferably in a range of about 3-50 nm, and most preferably from about 10-40 nm or 20-30 nm thick. Other possible alternatives for matching/adhering Cu 46 to the back glass substrate 42 may include, for example, and without limitation, a thin (e.g., ~1-10 nm) titanium (Ti) or chromium (Cr) layer, which alternative(s) may be used together with or instead of the illustrated $CuO_X$ matching/adhesion layer 44. Optionally, the above-discussed dielectric layer (e.g., of or including silicon nitride and/or silicon oxynitride) may be provided directly on the back substrate 22 so as to be located between the back substrate 22 and the matching/adhesion layer 44 of or including $CuO_X$.

In addition to the matching/adhesion layer 44, according to an example embodiment, a further layer that may be used to reduce mechanical stress between the Mo layer 50 and the Cu layer 46, and to provide CTE matching, may be provided. With continuing reference to FIG. 3, an additional matching layer 48 of or including an alloy of Mo and Cu may be introduced to reduce mechanical problems that may possibly be associated with the Mo/Cu back contact stack. For example, a mismatch in the linear coefficient of thermal expansion (CTE) may be present between the Mo 50 and Cu 46 of the multi-layer back contact stack. In an effort to reduce the possibility of mechanical problems and/or improve durability in the Mo/Cu stack in other possible designs (e.g., thicker layers, higher temperatures, additional layers, etc.), according to an example embodiment, a stress mitigating CTE matching layer 48 comprising an alloy of MoCu between the Mo and Cu may be introduced. Such a layer may be deposited using, for example, and without limitation, sputter deposition. MoCu composites provide flexibility and easily tailor the CTE and provide good thermal conductivity. Table I above demonstrates excellent CTE matching properties of MoCu alloys for Mo (CTE $\sim 17 \times 10^{-6}/^\circ$ K) and Cu (CTE $\sim 5 \times 10^{-6}/^\circ$ K) layers. In the example embodiments described herein, the MoCu CTE matching layer 48 may for example, and without limitation, have preferred compositions in the range of from about 30 wt. % Mo/70 wt. % Cu to 70 wt. % Mo/30 wt. % Cu. In other words, the Mo content of the MoCu matching layer 48 may be from about 30-70%, and the Cu content of the same layer 48 may also be from about 30-70%, with each more preferably being from about 40-60%. Moreover, a thickness of the MoCu stress matching layer 48 is, for example, preferably in a range of 5-50 nm, more preferably from about 5-25 nm, and more preferably about 10 nm.

In accordance with these and other example embodiments disclosed herein, the portion of the back contact between the Cu 46 and the CIGS absorber 54 remains to be of or including Mo 50. As in FIG. 2, the use of Mo (e.g., metallic or substantially metallic conductive Mo based layer 50) between the Cu and the CIGS absorber 54 in FIG. 3 has numerous operational and structural advantages. Among these advantages is that Mo forms a thin (e.g., about 3-60 nm, depending on Mo quality parameters, such as, for example, density, purity, stress, etc.) molybdenum selenide ($MoSe_2$) layer 52 at its interface with the CIGS absorber 54 during the high-temperature selenization process (discussed above) that may be used to form the CIGS absorber 54. The formation of a $MoSe_2$ layer 52 is beneficial for the CIGS device 40 in that it results in the formation of an ohmic (non-rectifying) contact to the CIGS absorber 54 which, in turn, facilitates hole extraction with minimum losses. Another advantage of Mo 50 between the Cu 46 and the CIGS absorber 54 is that Mo works well with the second mechanical scribe in the CIGS photovoltaic module manufacturing process. Sputter deposited Mo also produces a specific surface morphology that is beneficial for CIGS growth and particularly for the formation of crystallites with large grains sizes that result in high carrier mobility and thus, higher device efficiency.

It is noted that substituting a portion of the traditional Mo back contact with Cu (a part of which can also be MoCu alloy as discussed above) according to certain example embodiments of this invention does not substantially change the band diagram and facilitates hole extraction with minimal losses. This is due to the fact that Cu has a substantially similar work function as Mo (e.g., about 4.6 eV), and that the width of the carrier depletion region in the metal is negligible. Moreover, the use of $CuO_X$ adjacent to the back glass substrate does not significantly impact current flow between individual cells.

Figure 4:
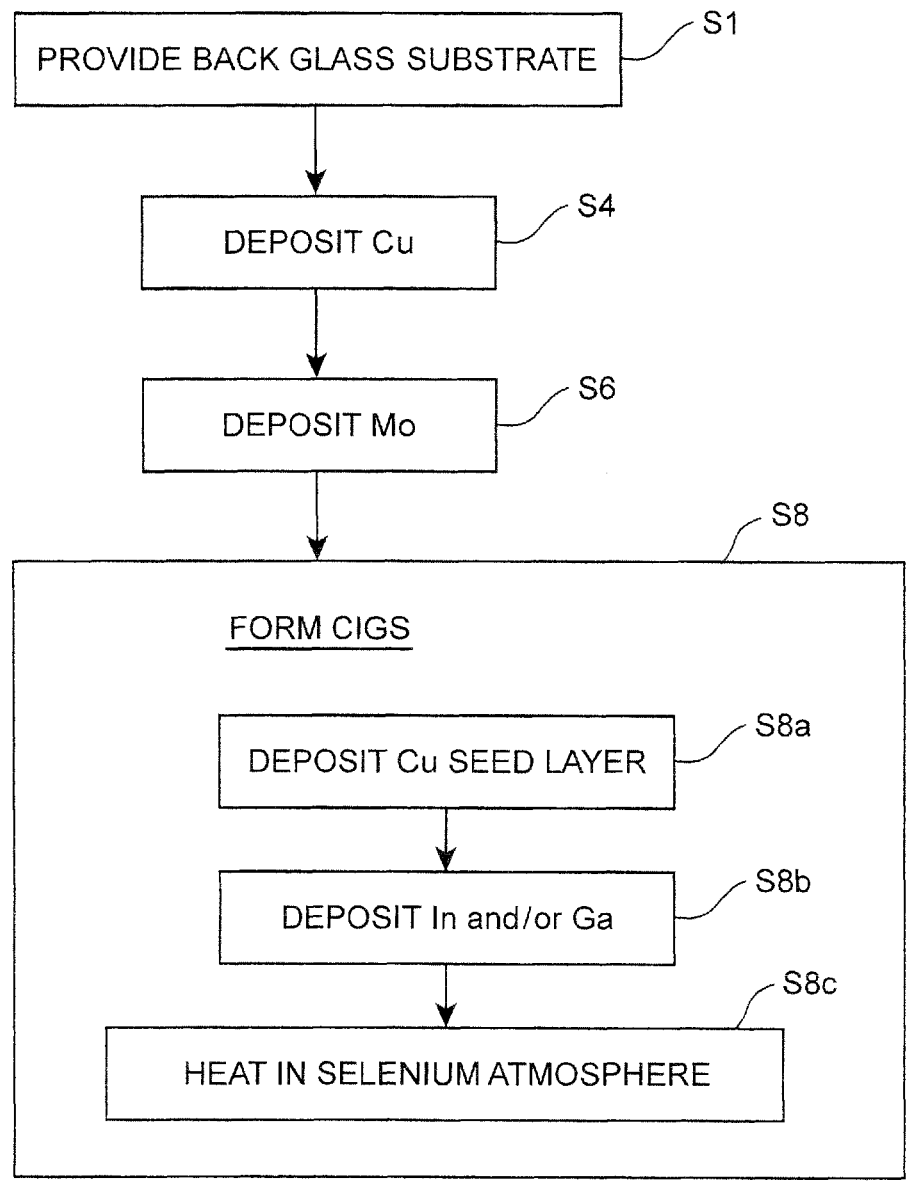
FIG. 4 is a flowchart illustrating a method of making a coated article for use in a photovoltaic device, such as, for example, a solar cell, according to certain example embodiments disclosed herein.

With reference to FIG. 4, an example method of making a coated article for use in a photovoltaic device, such as, for example, a solar cell, according to certain example embodiments disclosed herein, such as, for example, and without limitation, the photovoltaic device(s) illustrated in FIG. 2 and/or FIG. 3 is described. A back glass substrate 22 (or 42), which may, for example, and without limitation, comprise soda-lime-silica based glass may be provided (S1) as a substrate for a coated article for use in a photovoltaic device, such as, for example, a solar cell. A multi-layer back contact configuration comprising conductive layers including Cu and Mo is then provided. According to certain example embodiments, the multi layer back contact comprising a Cu layer 24 (or 44, 46, and/or 48) and a Mo layer 26 (or 50) is deposited on the back glass substrate 22 (or 42) in steps S4 and S6, respectively. In an example embodiment, a preferred method of depositing the Cu layer 24 (or 44, 46, and/or 48) and the Mo layer 26 (or 50) is by direct-current magnetron sputtering. The thicknesses of the Cu layer and/or Mo layer are as discussed above in connection with FIG. 2 and/or 3. The thickness of the Mo layer 26 (or 50) may, according to example embodiments herein, preferably be, for example, in the range of about 5-300 nm, which is substantially thinner than conventional Mo layers that serve as back contacts in photovoltaic devices, such as the photovoltaic device illustrated in FIG. 1. After the multi-layer back contact structure comprising a Cu layer and a Mo layer is deposited on the back glass substrate 22, as discussed above, the active or absorbing region 28 (or 54) of the photovoltaic device is then deposited on (directly or indirectly) the Mo layer 26 (or 50) of the multi-layer back contact structure. As described above, according to certain embodiments, the active or absorbing layer 28 (or 54) preferably comprises a semiconductor layer 28 comprising copper indium diselenide or p-type CIGS layer (approximately $Cu(In, Ga)(Se, S)_2$). The CIGS film 28 (or 54) may be formed S8, for example, by depositing a "seed" layer comprising Cu by, for example, co-evaporation, sputtering, electroplating or any other suitable deposition technique S8a.

Other components of the CIGS absorbing film, e.g., indium and/or gallium, are deposited on the Cu layer S8b and react with the Cu at high temperature, such as, for example, about 550° C., in a selenium atmosphere S8c, thereby forming the CIGS semiconductor absorber in step S8. The steps described so far are directed to forming a coated article for use in a photovoltaic device (e.g. a solar cell). Further processing steps may be performed to complete a photovoltaic device. For example, deposition of the CIGS absorber may be followed by wet-deposition of a cadmium sulfide (CdS) window layer 30. Additionally, a wide bandgap semiconductor material, such as, for example, a bi-layer of a ZnO and an n-type conductive Al-doped ZnO 32 may be formed on the CdS window 30 for use as a front electrode. The device 20 (or 40) may then be completed by providing a series of front face contacts in the form of, for example, a metal grid (not shown), on top of the front electrode, and a front glass substrate comprising, for example, soda-lime silica based glass.

Figure 5:
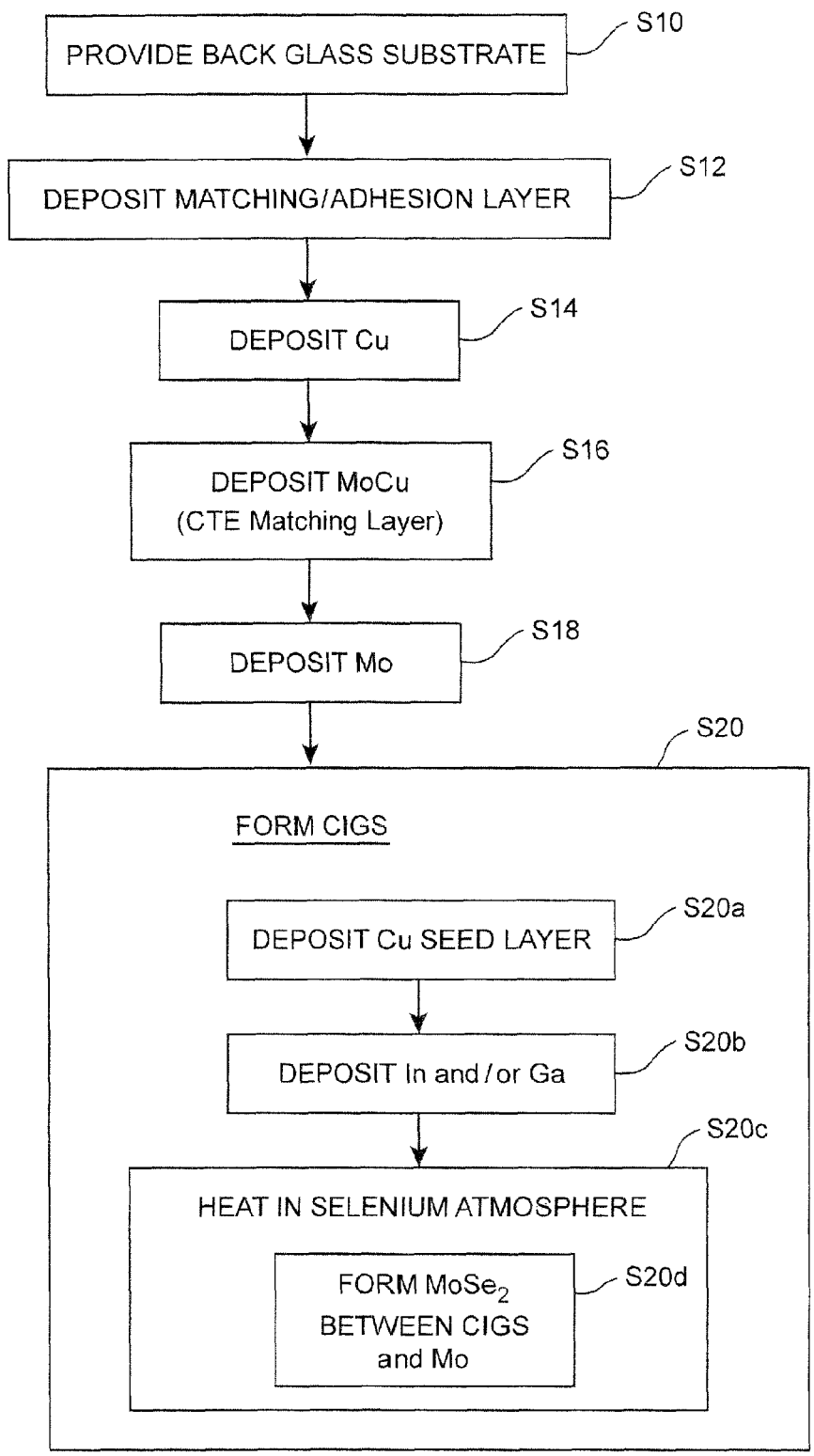
FIG. 5 is another flowchart illustrating a method of making a coated article for use in a photovoltaic device, such as, for example, a solar cell, according to certain example embodiments disclosed herein.

FIG. 5 is an illustration of steps that may be taken in making a coated article for use in a photovoltaic device according to certain example embodiments disclosed herein, such as, for example, the example coated article illustrated in FIG. 3. In addition to the steps discussed above with respect to FIG. 4, further steps may be taken to realize other example embodiments. For example, after providing the back glass substrate in S10, a stress matching or adhesion layer comprising, for example, copper oxide ($CuO_X$) may be deposited S12 on the back glass substrate 42 prior to the step of depositing the layer comprising Cu 46 of the multi-layer back contact configuration S14. The $CuO_X$ layer 44 is used to form a solid bond between the back glass substrate 42 and the Cu layer 46 of the multi-layer back contact configuration, as metal copper does not generally adhere well to the glass. The stress matching or adhesion layer 44, according to certain example embodiments, may be deposited, for example, and without limitation, by reactive sputtering from a metal Cu target in an argon and oxygen ($Ar+O_2$) atmosphere, wherein the partial pressures of oxygen may be, for example, and without limitation, around about 0.3 to 0.6 mTorr. The resulting thickness of the $CuO_X$ matching/adhesion layer 44 may be, for example, preferably in a range of ~1-60 nm, and more preferably in a range of about 3-50 nm. Other possible alternatives for matching/adhering Cu to the back glass substrate may include, for example, and without limitation, a thin (e.g., ~1-10 nm) titanium (Ti) or chromium (Cr) layer. After the matching/adhesion layer 44 is deposited on the back glass substrate 42, a portion of the multi layer back contact comprising a Cu layer 46 is deposited on matching/adhesion layer 44 in step S14, along the lines described above with respect to FIG. 4. As noted above, in an example embodiment, a preferred method of depositing the Cu layer 46 is by direct-current magnetron sputtering. According to certain example embodiments, such as illustrated in FIG. 3, a CTE matching layer comprising an alloy of Mo and Cu 48 may also be provided S16 by, for example, sputtering, between the layer including Cu 46 and the layer including Mo 50 of the multi-layer back contact configuration. This MoCu layer 48 serves to reduce potential mechanical problems that may be associated with the contact stack as discussed in greater detail above. After the CTE matching layer comprising MoCu 48 is deposited S16 on the back glass substrate 42, a portion of the multi-layer back contact comprising a Mo layer 50 is deposited on CTE matching layer 48 in step S18, along the lines described above with respect to FIG. 4. As noted above, in an example embodiment, a preferred method of depositing the Mo layer 50 is by direct-current magnetron sputtering. The CIGS absorber 54 is then formed (S20, S20a, S20b, S20c)

over the portion of the multi-layer back contact comprising a Mo layer 50, along the lines discussed above with respect to FIG. 4. However, it is noted that during the high temperature selenization process S20c used to form the CIGS absorber 54, a portion of the Mo layer 50 forms a thin (e.g., 3-60 nm depending upon Mo quality parameters) layer comprising MoSe$_2$, 52 (S20d). The formation of a MoSe, layer has numerous benefits as discussed in detail above with reference to FIG. 3.

In certain example embodiments of this invention (e.g., see FIG. 2 and/or FIG. 3), there is provided a photovoltaic device (e.g., solar cell) comprising: a front substrate; a semiconductor absorber film; a back contact comprising a first conductive layer comprising or consisting essentially of copper and a second conductive layer comprising or consisting essentially of molybdenum; and a rear substrate; wherein the first conductive layer comprising of consisting essentially of copper is located between at least the rear substrate and the second conductive layer comprising or consisting essentially of molybdenum, and wherein the semiconductor absorber film is located between at least the back contact and the front substrate.

The photovoltaic device of the preceding paragraph may include a semiconductor absorber film comprising or consisting essentially of CIGS.

In the photovoltaic device of any of the preceding two paragraphs, the first conductive layer comprising copper may include an oxidation graded portion wherein oxygen concentration is higher at a region closer to the rear substrate and is lower at a region closer to the second conductive layer comprising molybdenum.

In the photovoltaic device of any of the preceding three paragraphs, the first conductive layer comprising or consisting essentially of copper may directly contact the second conductive layer comprising or consisting essentially of molybdenum.

In the photovoltaic device of any of the preceding four paragraphs, said oxidation graded portion may or may not be continuously graded.

In the photovoltaic device of any of the preceding five paragraphs, a first stress matching layer comprising CuO$_X$ may be disposed adjacent the rear substrate and between the rear substrate and the first conductive layer comprising or consisting essentially of copper.

In the photovoltaic device of any of the preceding six paragraphs, a stress mitigating layer may be disposed between the first conductive layer of the back contact and the second conductive layer of the back contact, said stress mitigating layer comprising an alloy of copper and molybdenum.

In the photovoltaic device of any of the preceding seven paragraphs, an ohmic contact may be formed between the semiconductor absorber and the second conductive layer, said ohmic contact comprising MoSe$_2$ formed during a selenization step.

In the photovoltaic device of any of the preceding eight paragraphs, a substantially transparent conductive front contact comprising a substantially transparent metal oxide may be provided. The substantially transparent front contact may possibly be doped with an n-type conductive metal. The transparent front contact may comprise a bi-layer comprising ZnO and ZnO doped with n-type conductive Al in certain example embodiments.

In the photovoltaic device of any of the preceding nine paragraphs, a dielectric layer (e.g., of or including silicon nitride and/or silicon oxynitride) may be provided on the back substrate between at least the back substrate and the first conductive layer that includes copper.

While certain example aspects of a coated article for use in photovoltaic devices and methods for making the same are described and discussed with respect to various example embodiments herein, it is to be understood that these example embodiments are meant to illustrative, not limiting. One skilled in the art would understand that various modifications may be made without departing from the true spirit and full scope of the following claims.

What is claimed is:

1. A photovoltaic device, comprising:
    a front substrate;
    a semiconductor absorber film;
    a back contact comprising a first conductive layer comprising copper and a second conductive layer comprising molybdenum;
    a rear substrate;
    wherein the first conductive layer comprising copper is located between at least the rear substrate and the second conductive layer comprising molybdenum, and wherein the semiconductor absorber film is located between at least the back contact and the front substrate; and
    a stress mitigating layer disposed between the first conductive layer of the back contact and the second conductive layer of the back contact, said stress mitigating layer comprising an alloy of copper and molybdenum.

2. The photovoltaic device of claim 1, wherein the semiconductor absorber film comprises CIGS.

3. The photovoltaic device of claim 1, wherein the first conductive layer comprising copper includes an oxidation graded portion wherein oxygen concentration is higher at a region closer to the rear substrate and is lower at a region closer to the second conductive layer comprising molybdenum.

4. The photovoltaic device of claim 3, wherein said oxidation graded portion is not continuously graded.

5. The photovoltaic device of claim 1, further comprising a first stress matching layer comprising CuO$_X$ disposed adjacent the rear substrate and between the rear substrate and the first conductive layer comprising copper.

6. The photovoltaic device of claim 1, further comprising an ohmic contact formed between the semiconductor absorber and the second conductive layer, said ohmic contact comprising MoSe$_2$.

7. The photovoltaic device of claim 1, further comprising a substantially transparent conductive front contact comprising a substantially transparent metal oxide.

8. The photovoltaic device of claim 1, wherein the stress mitigating layer comprising copper and molybdenum is located between and directly contacting the first and second conductive layers.

9. The photovoltaic device of claim 1, wherein the first conductive layer consists essentially of copper.

10. The photovoltaic device of claim 1, wherein the first conductive layer consists essentially of copper and the second conductive layer consists essentially of molybdenum.

11. The photovoltaic device of claim 1, wherein the first and second conductive layers are metallic.

12. The photovoltaic device of claim 1, wherein the stress mitigating layer is metallic.

13. The photovoltaic device of claim 1, wherein the stress mitigating layer is conductive and contains more Mo than Cu by weight percentage.

14. The photovoltaic device of claim 1, wherein the stress mitigating layer is from about 5-25 nm thick.

15. A photovoltaic device, comprising:
    a front substrate;
    a semiconductor absorber film;

a back contact comprising a first conductive layer comprising copper and a second conductive layer comprising molybdenum;

a rear substrate;

wherein the first conductive layer comprising copper is located between at least the rear substrate and the second conductive layer comprising molybdenum, and wherein the semiconductor absorber film is located between at least the back contact and the front substrate; and a stress mitigating layer disposed between and directly contacting the first conductive layer of the back contact and the second conductive layer of the back contact, said stress mitigating layer being conductive and comprising copper and molybdenum.

16. The photovoltaic device of claim 15, further comprising an ohmic contact formed between the semiconductor absorber and the second conductive layer, said ohmic contact comprising $MoSe_2$.

17. The photovoltaic device of claim 15, wherein the first conductive layer consists essentially of copper.

18. The photovoltaic device of claim 15, wherein the first conductive layer consists essentially of copper and the second conductive layer consists essentially of molybdenum.

19. The photovoltaic device of claim 15, wherein the first and second conductive layers are metallic.

20. The photovoltaic device of claim 15, wherein the stress mitigating layer is metallic.

21. The photovoltaic device of claim 15, wherein the stress mitigating layer is conductive and contains more Mo than Cu by weight percentage.

22. The photovoltaic device of claim 15, wherein the stress mitigating layer is from about 5-25 nm thick.

* * * * *